United States Patent [19]
Cava et al.

[11] Patent Number: 5,538,767
[45] Date of Patent: Jul. 23, 1996

[54] METHOD FOR GROWING TRANSPARENT CONDUCTIVE $GaInO_3$ FILMS BY PULSED LASER DEPOSITION

[75] Inventors: Robert J. Cava, Bridgewater; Julia M. Phillips, Mountainside; Gordon A. Thomas, Princeton, all of N.J.

[73] Assignee: AT&T Corp., Murray Hill, N.J.

[21] Appl. No.: 377,546

[22] Filed: Jan. 24, 1995

Related U.S. Application Data

[62] Division of Ser. No. 143,813, Oct. 27, 1993.

[51] Int. Cl.⁶ .................................................. C23C 14/28
[52] U.S. Cl. .......................................... 427/596; 427/586
[58] Field of Search ..................... 204/157.41; 427/596, 427/597, 586

[56] References Cited

U.S. PATENT DOCUMENTS

| | | | |
|---|---|---|---|
| 4,187,336 | 2/1980 | Gordon | 428/34 |
| 4,595,634 | 6/1986 | Gordon | 428/428 |
| 5,015,492 | 5/1991 | Venkatersan et al. | 427/596 |
| 5,386,798 | 2/1995 | Lowndes et al. | 117/50 |
| 5,405,659 | 4/1995 | Fernandez et al. | 427/596 |
| 5,411,772 | 5/1995 | Cheung | 4/4 |

OTHER PUBLICATIONS

G. Haacke, "Transparent Conducting Coatings", *Ann. Rev. Mater. Sci*, pp. 73–93, (1977).

C. G. Granqvist, "Solar Energy Materials: Overview and Some Examples", *Appl. Phys. A.*, vol. 52, pp. 83–93, (1991).

J. P. Zheng et al. "Low Resistivity Indium Tin Oxide by Pulsed Laser Deposition", *Appl. Phys. Lett.*, vol. 63 p. 1, (1993).

*Primary Examiner*—John Niebling
*Assistant Examiner*—Kishor Mayekar
*Attorney, Agent, or Firm*—Glen E. Books

[57] ABSTRACT

Applicants have discovered that films of conductively doped $GaInO_3$ grown on substrates by pulsed laser deposition have conductivity comparable to conventional wide band-gap transparent conductors while exhibiting superior light transmission, particularly in the green and blue wavelength regions of the visible spectrum. Substrate temperatures ranged from room temperature to 350° C. in an ambient containing oxygen at partial pressure in the range 0.1 mTorr to 100 mTorr. The preferred laser source was an excimer laser operating in the deep ultraviolet.

4 Claims, 2 Drawing Sheets

하
METHOD FOR GROWING TRANSPARENT CONDUCTIVE GaInO₃ FILMS BY PULSED LASER DEPOSITION

This application is a divisional of copending application Ser. No. 08/143,813, filed on Oct. 27, 1993.

FIELD OF THE INVENTION

The present invention relates to methods for growing conductive films and, in particular, to a method for growing a transparent conductive film comprising $GaInO_3$.

BACKGROUND OF THE INVENTION

A new transparent conductive material comprising $GaInO_3$ is disclosed in the concurrently filed application of Robert J. Cava entitled "Transparent Conductors Comprising Gallium-Indium-Oxide" which is incorporated herein by reference. Specifically, $GaInO_3$ can be doped with aliovalent elements having valence greater than 3 to achieve resistivities of less than 10 milliohm-cm. This material in bulk form exhibits conductivity comparable to conventional wide band-gap transparent conductors while exhibiting superior light transmission, particularly in the blue wavelength region of the visible spectrum, and enhanced index matching with typical glass substrates. Preferred forms of the material are $GaIn_{1-x}M_xO_3$ or $Ga_{1-y}InM_yO_3$ where $0.005 \leq x, y \leq 0.12$. Preferred dopants (M) are Sn, Si, Ge, Ti or combinations thereof.

While the bulk material exhibits highly promising qualities, the primary use of transparent conductive materials is as coatings on transparent substrates such as glass, fused silica, plastic and semiconductors. The present invention is directed to methods for coating this material on such substrates in such a fashion as to retain its conductivity and superior light transmission qualities. It also pertains to the resulting products.

SUMMARY OF THE INVENTION

Applicants have discovered that films of conductively doped $GaInO_3$ grown on substrates by pulsed laser deposition have conductivity comparable to conventional wide band-gap transparent conductors while exhibiting superior light transmission, particularly in the green and blue wavelength regions of the visible spectrum. Substrate temperatures ranged from room temperature to 350° C. in an ambient containing oxygen at partial pressure in the range 0.1 mTorr to 100 mTorr. The preferred laser source was an excimer laser operating in the deep ultraviolet.

BRIEF DESCRIPTION OF THE DRAWING(S)

The advantages, nature and various additional features of the invention will appear more fully upon consideration of the illustrative embodiments now to be described in detail in connection with the accompanying drawings. In the drawings.

It is to be understood that these drawing are for illustrating the concepts of the invention and, except for the graph, are not to scale.

DETAILED DESCRIPTION

Figure 1:
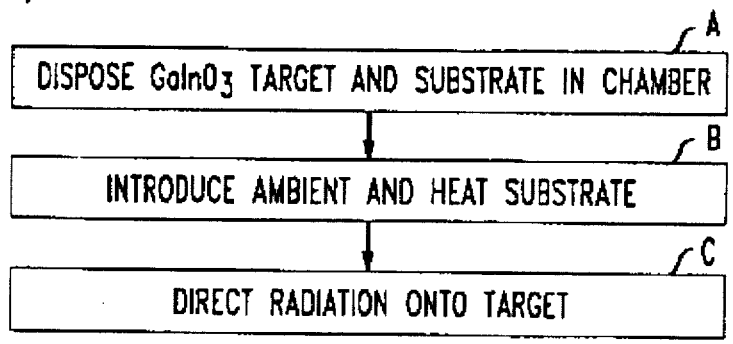
FIG. 1 is a block diagram showing the steps in growing a transparent film of conductively doped $GaInO_3$ on a substrate.

Referring to the drawings, FIG. 1 is a block diagram showing the steps in growing a transparent film of conductively doped $GaInO_3$ on a substrate. As preliminary steps, a target of conductively doped $GaInO_3$ is provided, as well as a substrate onto which the film is to be grown. The substrate can be glass, fused silica, plastic or semiconductor such as monocrystalline silicon. The target is conveniently a 1" diameter, ⅛" thick pellet of $Ga_{1-x}Ge_xIn_{1-y}Sn_yO_3$ prepared by solid state reaction as described in the aforementioned application of R. J. Cava.

An exemplary suitable target can be prepared as follows. Powdered gallium oxide, $Ga_2O_3$, indium oxide, $In_2O_3$, and tin oxide, $SnO_2$, are weighed out to yield the appropriate mole ratios for $GaIn_{1-x}Sn_xO_3$. For instance, for a 5-gram total weight sample of $GaIn_{.94}Sn_{.06}O_3$, 2.0090 grams of $Ga_2O_3$, 2.7972 grams of $In_2O_3$ and 0.1938 grams of $SnO_2$ are used. The powders are mixed together and ground together in a mechanical mortar and pestle for a minimum of five minutes to insure good mixing and contact of powder particles. The mixed powders are transferred into high density aluminum oxide crucibles with cover and heated in air for an initial period of 12–15 hours at temperatures between 1100° and 1200° C. in air. The resulting powders are then ground mechanically again, re-introduced into the covered aluminum oxide crucibles, and heated for a period of 12–15 hours at 1300° C. in air. After a third grinding, pellets are pressed in a standard steel dye (typically to a load of 3000 pounds for a half-inch diameter pellet). The pellets are then heated again at 1300° C. in air for a period of up to 60 hours. Pellets are typically placed on powder of their own composition inside the covered aluminum oxide crucibles for the pellet firing step. The pellets are cooled after this heating step at the natural cooling rate of the furnace, which in our case results in reaching 300° C. in approximately three hours, at which point the pellets are removed from the furnace. The resulting pellets are typically single phase materials (to the detectability limits of standard powder x-ray diffraction) of the $GaInO_3$ structure type. Air is selected as an ambient for the initial processing steps because of its convenience. Covers are placed over the crucibles as a precaution to prevent evaporation of the oxides, but we have not observed evaporation under the conditions described. The first air firing need not necessarily be in the 1100°–1200° C. range, but we select an initial low temperature to reduce the possibility of metastable melting. The final heating temperature of 1300° C. in air gave more satisfactory conductivities, in one set of experiments, than did a 1400° C. air treatment The times and temperatures of these treatments are expected to be dependent on the reactivities of the starting materials and the efficiencies of the grinding operations. Shorter times can be expected to give equally satisfactory results in the preparation of ceramic targets for sputtering or laser ablation.

Alternatively, for applications which do not require the highest conductivity, pellets of undoper $GaInO_3$ after firing can be heated in a reducing ambient (e.g. nitrogen-hydrogen (15 mole percent hydrogen) at 600°–650° C.). Such targets produce conductive films. It is believed that they are effectively doped by oxygen vacancies.

Figure 2:
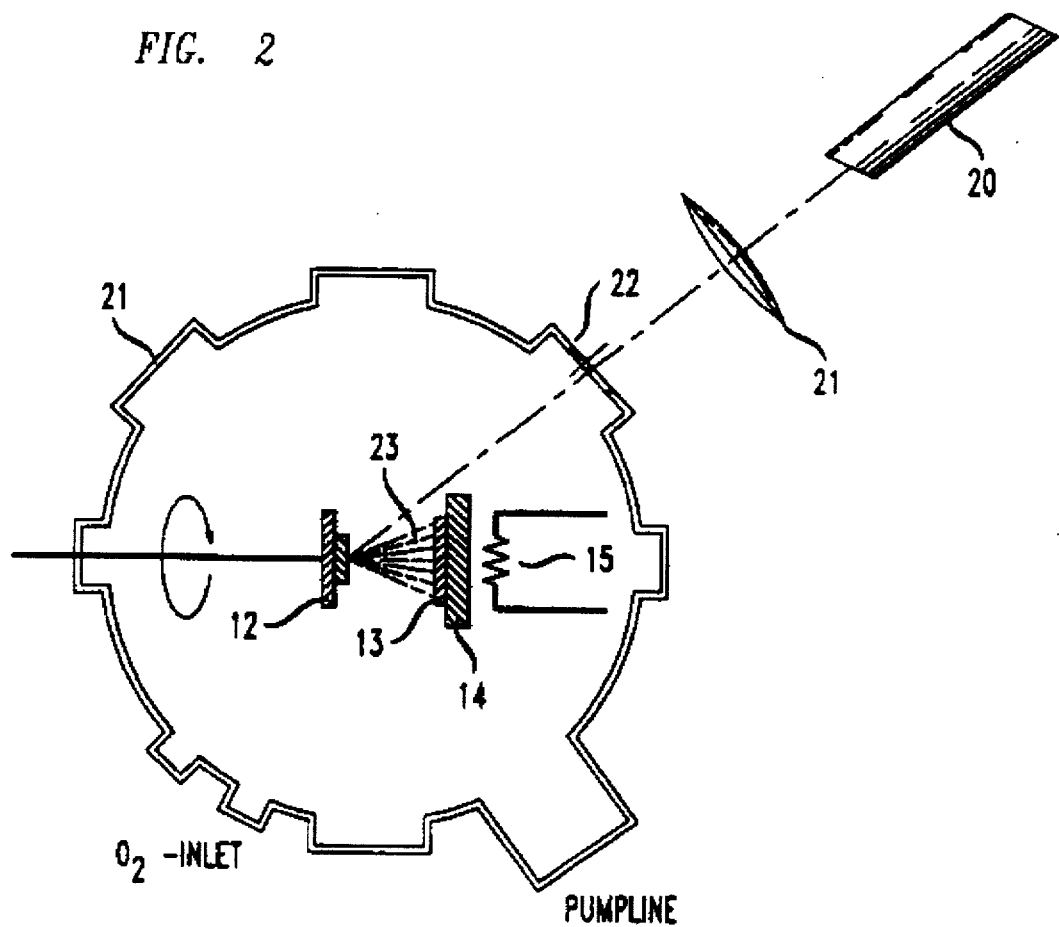
FIG. 2 is a schematic view of apparatus useful in practicing the process of FIG. 1.

The first step shown in block A of FIG. 1 is to dispose the target of conductively doped GaInO$_3$ and the substrate in an evacuable chamber. As shown in FIG. 2, the GaInO$_3$ target 10 is mounted in chamber 11 on a movable base 12 (preferably rotatable) so that subsequent laser exposure does not drill a hole in the target. The substrate 13, which is preferably transparent material, is mounted on a holder 14 adjacent a heating element 15 for permitting control of the substrate temperature. The target and the substrate are preferably mounted so that the surface to be coated faces the target. Exemplary spacing between the target and the substrate surface is about 8 cm.

The next step illustrated in block B of FIG. 1 is to immerse the target and substrate in a low pressure ambient (total pressure≦100 m Torr) containing oxygen at partial pressure in the range 0.1 mTorr to 100 mTorr and to heat the substrate to a desired temperature in the range between room temperature and 350° C. Temperatures and/or pressures beyond these ranges tend to deteriorate the transparency or conductivity of the coating. As a preliminary step the chamber can be evacuated to a base pressure of $1-10\times10^{-7}$ Torr, and oxygen is then bled into the chamber. The substrate can then heated to a preferred growth temperature.

The third step shown in block C of FIG. 1 is to direct upon the target laser radiation for evaporating a portion of the target. As shown in FIG. 2 radiation from laser 20 is focussed by lens 21 through chamber window 22 onto rotating target 10, thereby ablating material 23 from the target onto the substrate 13. Preferably the laser is a KrF excimer laser operating in the deep ultraviolet region (e.g., 248 nm). In the illustrated arrangement the energy density of the laser on the target is advantageously adjusted between 1 and 4 J/cm$^2$ and the pulse repetition rate is set at 10 Hz. With this apparatus, material is deposited a rate of 1000–1500 angstroms per hour to a thickness of several thousand angstroms.

After growth, the chamber can again be evacuated, and the coated substrate can be permitted to cool to room temperature. The films emerge from the chamber transparent to the eye and with good electrical conductivity.

Figure 3:
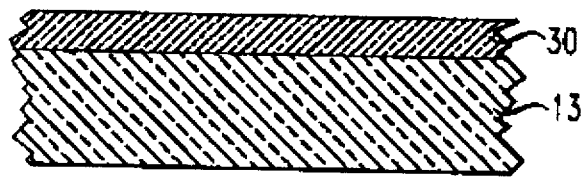
FIG. 3 is a cross section of a product produced by the process of FIG. 1.

FIG. 3 is a schematic cross section of the finished product showing a thin film 30 of polycrystalline, transparent conductive GaInO$_3$ on a transparent substrate 13. The film preferably has a thickness in the range 0.1 μm to 10 μm.

Figure 4:
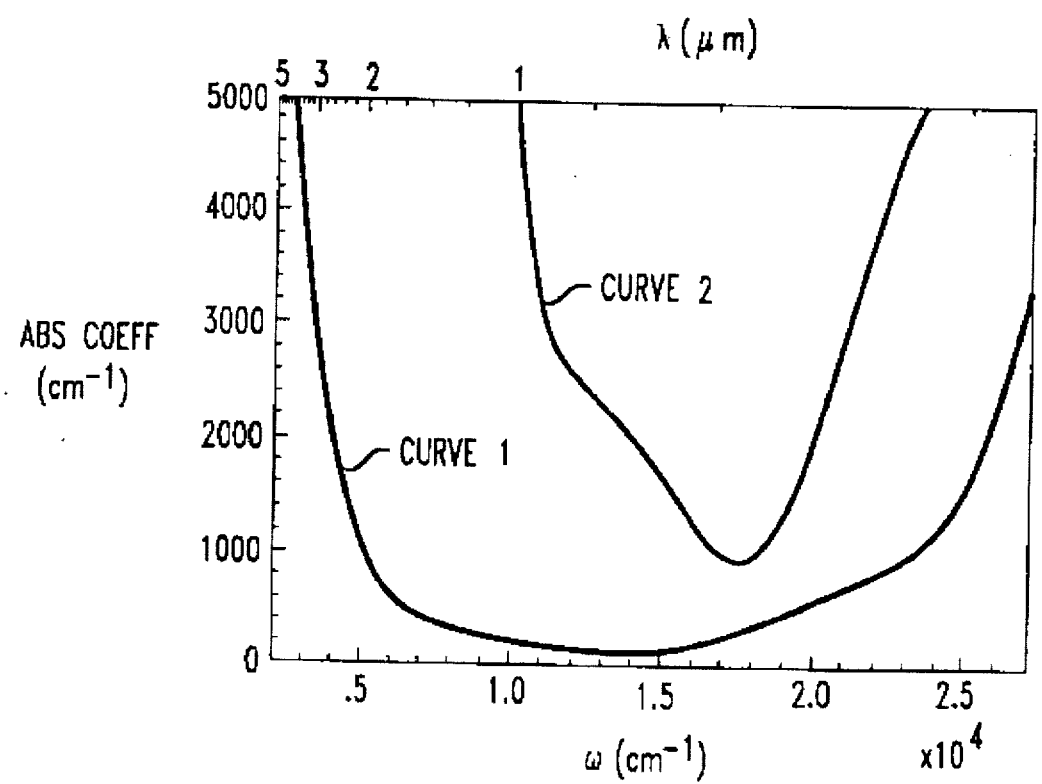
FIG. 4 is a graphical display of absorption versus wavelength for a typical film made in accordance with the process of FIG. 1.

FIG. 4 is a graphical display of the absorption spectrum for a typical product made in accordance with the process of FIG. 1 (curve 1) as compared to the absorption spectrum of conventional indium tin oxide (curve 2). The transmission is superior to indium tin oxide in all portions of the visible spectrum, especially in the green and blue wavelength regions.

Such films on transparent glass are useful as windows, selectively permitting passage of visible light while reflecting infrared and ultraviolet. On glass, silica, or plastic they can be used in a wide variety of optical display devices including active matrix liquid crystal display devices. And they can be used on semiconductors as transparent contacts for photo-optical devices such as solar cells, lasers, photodetectors and light emitting diodes.

It is to be understood that the above-described embodiments are illustrative of only a few of the many possible specific embodiments which can represent applications of the invention. Numerous and varied other arrangements can be made by those skilled in the art without departing from the spirit and scope of the invention.

We claim:

1. A method for coating a substrate with a transparent, conductive layer comprising GaInO$_3$ comprising the steps of:

disposing a target comprising GaInO$_3$ and a substrate to be coated in an ambient having oxygen at partial pressure in the range 0.1 mTorr to 100 mTorr, said substrate disposed adjacent said target for receiving material evaporated from said target;

heating the substrate to a temperature in the range between room temperature and 350° C.; and shining onto said target pulsed laser light for evaporating a portion of said target onto said substrate, thereby coating on said substrate a transparent, conductive layer comprising GaInO$_3$.

2. The method of claim 1 wherein the GaInO$_3$ is doped with an aliovalent material having a valence greater than 3 to a resistivity of less than 10 milliohm-cm.

3. The method of claim 2 wherein said aliovalent material is tin, germanium, silicon, titanium or a combination thereof.

4. The method of claim 1 wherein the GaInO$_3$ is undoped and deficient in oxygen.

\* \* \* \* \*